(12) United States Patent
Harada

(10) Patent No.: US 6,710,402 B2
(45) Date of Patent: Mar. 23, 2004

(54) VERTICAL MOS TRANSISTOR AND A METHOD OF MANUFACTURING THE SAME

(75) Inventor: Hirofumi Harada, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 09/872,798

(22) Filed: Jun. 1, 2001

(65) Prior Publication Data

US 2002/0000608 A1 Jan. 3, 2002

(30) Foreign Application Priority Data

Jun. 2, 2000 (JP) ........................................ 2000-166214

(51) Int. Cl.[7] ........................... H01L 29/76; H01L 29/94
(52) U.S. Cl. ........................ 257/330; 257/329; 257/331; 257/332; 257/333; 438/270; 438/271
(58) Field of Search .................................. 257/329–333; 438/270–271, 259, 587–589

(56) References Cited

U.S. PATENT DOCUMENTS

| | | | | | |
|---|---|---|---|---|---|
| 5,016,067 A | * | 5/1991 | Mori | ............................ | 257/330 |
| 5,034,785 A | * | 7/1991 | Blanchard | .................... | 257/330 |
| 5,160,491 A | * | 11/1992 | Mori | ............................ | 438/270 |
| 5,508,534 A | * | 4/1996 | Nakamura et al. | ........... | 257/135 |
| 5,918,114 A | * | 6/1999 | Choi et al. | .................... | 438/134 |
| 5,945,723 A | * | 8/1999 | Mori | ............................ | 257/487 |
| 6,069,043 A | * | 5/2000 | Floyd et al. | ................. | 438/270 |
| 6,177,734 B1 | * | 9/2000 | Nakamura | .................... | 438/268 |
| 6,211,549 B1 | * | 4/2001 | Funaki et al. | ................ | 257/329 |
| 6,274,905 B1 | * | 8/2001 | Mo | ............................. | 257/330 |
| 6,323,518 B1 | * | 11/2001 | Sakamoto et al. | ........... | 257/330 |
| 6,461,918 B1 | * | 10/2002 | Calafut | ........................ | 438/270 |

* cited by examiner

*Primary Examiner*—Wael Fahmy
*Assistant Examiner*—Thao X. Le
(74) *Attorney, Agent, or Firm*—Adams & Wilks

(57) ABSTRACT

Disclosed are a vertical MOS transistor which lowers the gate resistance, improves the high frequency characteristics, and improves the yield compared with a conventional one and a method of manufacturing the same. When gate voltage is applied to a gate electrode, a channel is formed in a body region along a trench, and electrons or current flow(s) from a drain layer to a source layer. Here, a gate in the trench has a laminated structure of a polycrystalline silicon film and a metal silicide. Therefore, a gate resistance is lowered and the high frequency characteristics are improved. Further, according to the structure and the method of manufacturing, a concave portion generated at an upper portion of the gate in the trench when etching for forming the gate is less liable to be generated, and thus, malfunction and insufficient reliability due to the concave portion can be avoided.

3 Claims, 5 Drawing Sheets

Prior Art

Prior Art

VERTICAL MOS TRANSISTOR AND A METHOD OF MANUFACTURING THE SAME

BACKGROUND OF THE INVENTION

1. Field of the Invention

The present invention relates to a vertical MOS transistor having a trench structure and a method of manufacturing the same.

2. Description of the Related Art

FIG. 2 illustrates a schematic sectional view of a conventional vertical MOS transistor having a trench structure. A semiconductor substrate is prepared in which a lightly doped layer 2 of a first conductive (or conductivity) type is epitaxially grown on a heavily doped substrate 1 of the first conductive type to be a drain region. Then, a diffusion region 3 of a second conductive type referred to as a body region is formed from a surface of the semiconductor substrate by impurity implantation and high temperature thermal treatment at 1000° C. or higher. Further, from the surface, a heavily doped impurity region 7 of the first conductive type to be a source region and a heavily doped body contact region 8 of the second conductive type for the purpose of fixing a potential of the body region by an ohmic contact are formed and are connected to a source electrode 7a and a body electrode 8a, respectively. Here, since a potential of the source region of the first conductive type and a potential of the body contact region of the second conductive type are usually the same, they are laid out so as to be in contact with each other in FIG. 2. The source electrode 7a and the body electrode 8a are connected with each other through a contact hole, not shown in the figure, for electrically contacting the two regions. Then, a trench 4 is formed by etching single crystalline silicon through the source region of the first conductive type. A gate insulating film 5 and polycrystalline silicon 6 containing a high concentration of impurity to be connected to a gate electrode 9a fill the silicon trench. The heavily doped region of the first conductive type on a rear side of the semiconductor substrate is connected to a drain electrode 1a.

The above structure can function as a vertical MOS transistor in which current from a drain formed of the heavily doped region of the first conductive type on the rear side and an epitaxial region of the first conductive type to a source formed of the heavily doped region of the first conductive type on a front side is controlled through the gate insulating film on a side wall of the trench by a gate buried in the trench. This method can accommodate both an N channel type and a P channel type by appropriately making the conductive types N or P.

Further, the vertical MOS transistor having the trench structure has a characteristic that, since a channel is formed completely vertically, the transistor allows application of a method for a finer transistor.

A basic structure of such a vertical MOS transistor and a method of manufacturing the same are schematically disclosed in, for example, U.S. Pat. No. 4,767,722, etc.

However, such a structure of a vertical MOS transistor and a method of manufacturing the same have the following problems.

First, in the vertical MOS transistor manufactured by the conventional method, as illustrated in FIG. 2, an upper portion of the polycrystalline silicon filling the trench is concave. Such a concave portion is formed in a process of removing by etching back the polycrystalline silicon film deposited in the trench and on the semiconductor substrate until the surface is planarized. The concave portion is formed because, while the polycrystalline silicon film is deposited as illustrated in FIG. 10 and grains grow vertically on the gate insulating film in the trench, a border between grains formed when the grains come in contact with one another at a center line 11–11' in the trench has a higher etching rate than that in other regions of the polycrystalline silicon.

When the etching back of the polycrystalline silicon film is carried out excessively, even polycrystalline silicon in contact through the gate insulating film with the body region where the channel in the trench is formed may be removed, which may result in blockage of an operation of the transistor or result in formation of a void when a film is deposited thereon in a later process. Especially when the transistor is operated at a high temperature, a crack may be generated from the void to break the transistor itself. Thus, there is a problem that the etching back of the polycrystalline silicon film has to be carried out under sufficient control.

Secondly, since a gate electrode of the vertical MOS transistor having the trench structure is formed of polycrystalline silicon, there is a problem that a gate resistance is high and such a tendency grows especially as the transistor becomes finer. This impairs the high frequency characteristics. Generally, when the transistor is operated at a frequency of 500 kHz or higher, a delay in switching and lowered efficiency become nonnegligible.

SUMMARY OF THE INVENTION

In order to solve the above problems, according to the present invention, a vertical MOS transistor is characterized by a semiconductor substrate of a first conductive type, an epitaxial growth layer of the first conductive type formed on the semiconductor substrate, a body region of a second conductive type formed on the epitaxial growth layer, a trench formed through the body region of the second conductive type so as to reach an inside of the epitaxial growth layer of the first conductive type, a gate insulating film formed along a surface of the body region and a wall surface and a bottom surface of the trench, a polycrystalline silicon gate formed in the trench so as to be in contact with the gate insulating film and surrounded by the gate insulating film, a metal silicide gate as a film formed in the trench so as to be in contact with the polycrystalline silicon gate and surrounded by the gate insulating film and the polycrystalline silicon gate, a source region of the first conductive type formed on the surface of the body region and around the trench so as to be in contact with the gate insulating film, a gate electrode connected to the polycrystalline silicon gate and the metal silicide gate, a source electrode connected to the source region, and a drain electrode connected to the semiconductor substrate.

According to another aspect of the present invention, the vertical MOS transistor is characterized in that a film other than a metal suicide is formed in the trench so as to be in contact with the polycrystalline silicon gate and surrounded by the gate insulating film and the polycrystalline silicon gate, the other film being formed of a silicon compound.

According to still another aspect of the present invention, the vertical MOS transistor is characterized in that the film formed in the trench so as to be in contact with the polycrystalline silicon gate and surrounded by the gate insulating film and the polycrystalline silicon gate is especially a silicon oxide film.

According to yet another aspect of the present invention, the vertical MOS transistor is characterized in that the film formed in the trench so as to be in contact with the polycrystalline silicon gate and surrounded by the gate insulating film and the polycrystalline silicon gate is especially a silicon nitride film.

According to still another aspect of the present invention, the vertical MOS transistor is characterized in that the film formed in the trench so as to be in contact with the polycrystalline silicon gate and surrounded by the gate insulating film and the polycrystalline silicon gate is especially a metal film.

In order to attain the above, a method of manufacturing a vertical MOS transistor is characterized by comprising the steps of forming a body region of a second conductive type from a main surface of a semiconductor substrate of a first conductive type by injection and thermal diffusion of impurity of the second conductive type, forming a trench by carrying out anisotropic etching from a region on the body region where a trench is to be formed through the body region of the second conductive type to an inside of the semiconductor substrate, forming a gate insulating film along a surface of the body region and a wall surface of the trench, depositing on the gate insulating film a polycrystalline silicon layer having a thickness of half or less of the width of the trench, forming on the polycrystalline silicon layer a metal silicide layer as a film having a thickness of more than the difference between half of the trench width and the thickness of the polycrystalline silicon layer, etching the metal silicide layer, etching the polycrystalline silicon layer to form a gate in the trench, and forming a source region of the first conductive type on the surface of the body region and in contact with the gate insulating film.

According to another aspect of the present invention, the method of manufacturing a vertical MOS transistor is characterized in that a film other than a metal silicide is formed on the polycrystalline silicon layer, such as a silicon oxide film.

According to still another aspect of the present invention, the method of manufacturing a vertical MOS transistor is characterized in that the film formed on the polycrystalline silicon layer is a silicon nitride film.

According to yet another aspect of the present invention, the method of manufacturing a vertical MOS transistor is characterized in that the film formed on the polycrystalline silicon layer is a metal film.

DETAILED DESCRIPTION OF THE PREFERRED EMBODIMENTS

Embodiments of the present invention are now described with reference to the drawings.

Figure 1:
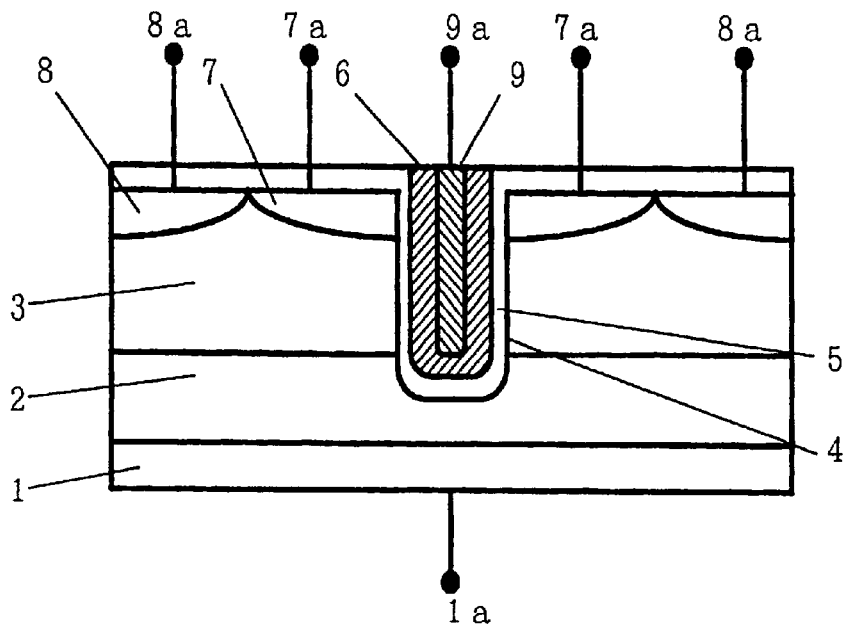
FIG. 1 is a schematic sectional view of a vertical MOS transistor according to the present invention.

FIG. 1 is a sectional view of an N channel vertical MOS transistor according to the present invention. A semiconductor substrate is prepared in which a lightly doped layer 2 of a first conductive type is epitaxially grown on a heavily doped substrate 1 of the first conductive type to be a drain region. Then, a diffusion region 3 of a second conductive type referred to as a body region is formed from a surface of the semiconductor substrate by impurity implantation and high temperature thermal treatment at 1000° C. or higher. Further, from the surface, a heavily doped impurity region 7 of the first conductive type to be a source region and a heavily doped body contact region 8 of the second conductive type for the purpose of fixing a potential of the body region by an ohmic contact are formed and are connected to a source electrode 7a and a body electrode 8a, respectively. Here, since a potential of the body contact region of the second conductive type and the potential of the body contact region of the second conductive type are the same, they are laid out so as to be in contact with each other in FIG. 1. The source electrode 7a and the body electrode 8a are connected with each other through a contact hole, not shown in the figure, for electrically contacting the two regions. These are structured in the same way as those of the conventional transistor. Then, a trench 4 is formed by etching single crystalline silicon through the source region of the first conductive type. A gate insulating film 5 is formed in a U-shaped form on an inner wall of the silicon trench such that the gate insulating film 5 covers a side wall and a bottom surface of the trench and has an internal U-shaped void therein. Polycrystalline silicon 6 containing a high concentration of impurity is filled in a U-shaped form inside the internal void of the gate insulating film in the trench so that the polycrystalline silicon 6 itself has an internal U-shaped void with a sidewall and a bottom surface. Further, metal silicide 9 is formed inside the internal void of the polycrystalline silicon 6 film in the trench so as to be in contact with the polycrystalline silicon 6 along the direction of the trench. The polycrystalline silicon 6 containing a high concentration of impurity and the metal silicide 9 are connected to a gate electrode 9a. The heavily doped region of the first conductive type on a rear side of the semiconductor substrate is connected to a drain electrode 1a.

The above structure can function as a vertical MOS transistor in which current from a drain formed of the heavily doped region of the first conductive type on the rear side and an epitaxial region of the first conductive type to a source formed of the heavily doped region of the first conductive type on a front side is controlled through the gate insulating film on a side wall of the trench by a gate formed of the polycrystalline silicon and of the metal silicide and buried in the trench. This method can accommodate both an N channel type and a P channel type by appropriately making the conductive types N or P.

Figure 3:
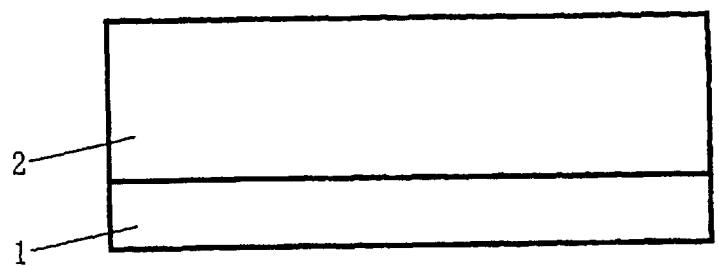
FIG. 3 is a schematic sectional view of a process of a method of manufacturing the vertical MOS transistor according to the present invention.

A method of manufacturing a vertical MOS transistor for implementing the present invention is now described with reference to FIG. 3 with regard to an N channel type transistor by way of example. First, a semiconductor substrate having the plane azimuth of 100 is prepared (FIG. 3) where an N type lightly doped epitaxial layer 2 at a thickness of several $\mu$m to several tens of $\mu$m with P doped at a concentration of $2e^{14}/cm^3$ to $4e^{16}/cm^3$ is on an N type heavily doped substrate 1 with As or Sb doped so that a resistivity is 0.001 $\Omega\cdot cm$ to 0.01 $\Omega\cdot cm$. The thickness and a concentration of an impurity of the N type epitaxial layer are arbitrarily selected depending on a required drain-source withstand voltage and current driving ability.

Then, by implanting B and then carrying out heat treatment for the purpose of forming a region to be a body of the vertical MOS transistor, a P type body region 3 having an impurity concentration of $2e^{16}/cm^3$ to $5e^{17}/cm^3$ and the depth of several/$\mu$m to ten plus several $\mu$m is formed. Then, a single crystalline silicon is exposed in a region where a trench is to be formed with an oxide film or a resist being a mask, and anisotropic etching is carried out by RIE to etch the silicon all the way through the body region. In this way, the trench is formed.

Figure 4:
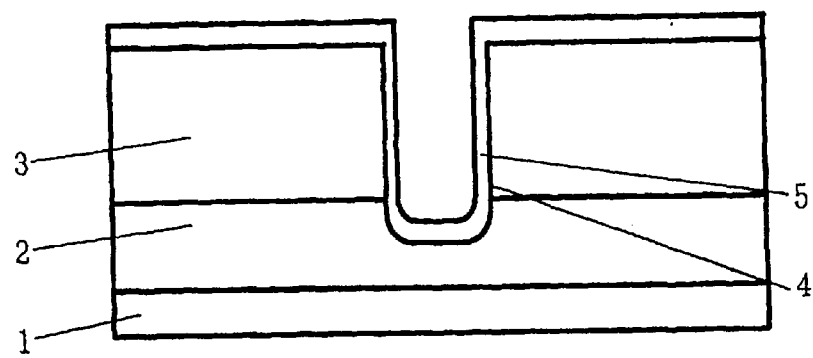
FIG. 4 is a schematic sectional view of a process of the method of manufacturing the vertical MOS transistor according to the present invention.

Then, edge portions of the trench are rounded by a well-known method such as high temperature sacrificial oxidation, isotropic dry etching, or the like. After that, a gate insulating film is formed on a side wall and a bottom surface of the trench (FIG. 4).

Figure 5:
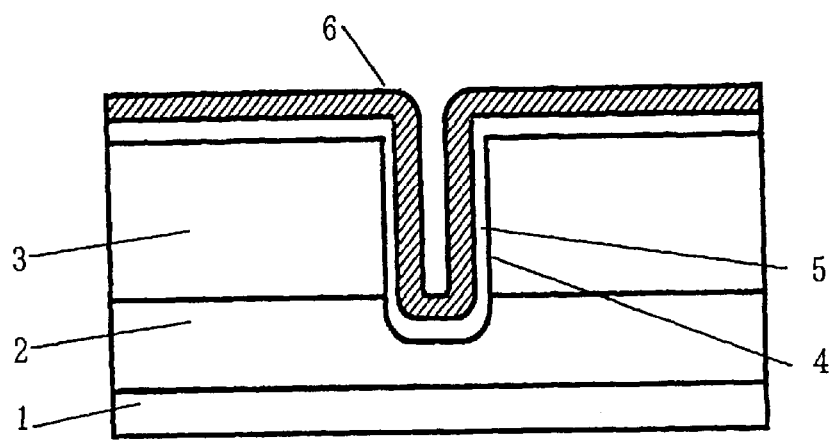
FIG. 5 is a schematic sectional view of a process of the method of manufacturing the vertical MOS transistor according to the present invention.

Then, as a process specific to the present invention, first, the polycrystalline silicon 6 containing a high concentration of impurity is deposited at a thickness according to a width of the trench so as not to completely fill the trench (FIG. 5). For example, when the width of the trench is 0.8 $\mu$m, the polycrystalline silicon is deposited to a thickness of 0.2 $\mu$m. The polycrystalline silicon containing a high concentration of impurity may be formed arbitrarily such as by implanting the impurity using thermal diffusion or ion implantation after polycrystalline silicon containing no impurity is deposited or by introducing the impurity while the polycrystalline silicon is being deposited.

Figure 6:
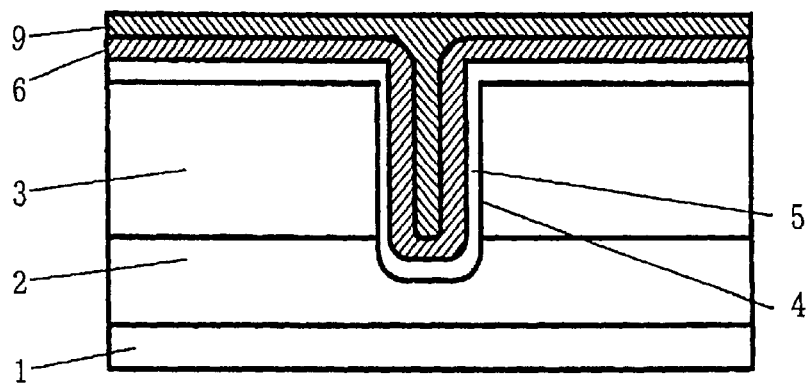
FIG. 6 is a schematic sectional view of a process of the method of manufacturing the vertical MOS transistor according to the present invention.

Then, a film of a refractory metal such as W, Ti, Mo, or the like is deposited to a thickness sufficient to completely fill the trench. By carrying out annealing at a high temperature in an nitrogen atmosphere for silicidation, such a metal silicide film is formed on the polycrystalline silicon film and inside the polycrystalline silicon film in the trench (FIG. 6). Alternatively, a metal silicide film similar to the above may be deposited and annealed as necessity arises. For example, when the polycrystalline silicon is deposited to a thickness of 0.2 $\mu$m with regard to the width of the trench of 0.8 $\mu$m, by forming the metal silicide film to a thickness of 0.2 $\mu$m or more as described above, the inside of the trench can be completely filled.

Figure 7:
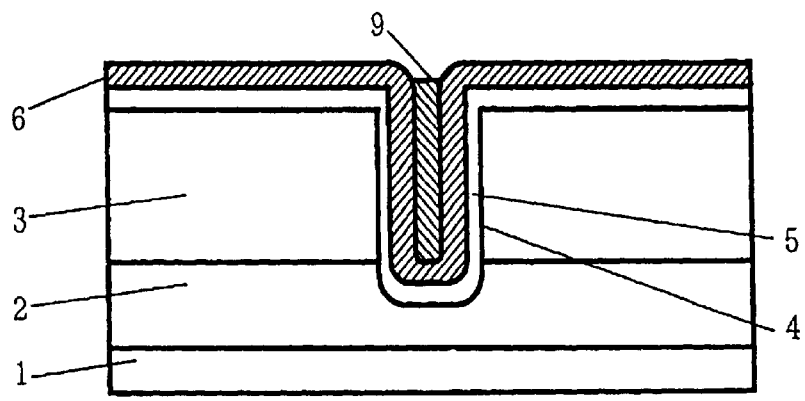
FIG. 7 is a schematic sectional view of a process of the method of manufacturing the vertical MOS transistor according to the present invention.

Then, after an oxide film on the metal silicide film is removed as necessity arises, the metal silicide film in regions other than in the trench is removed by etching back with gas having high selectivity with regard to the polycrystalline silicon (FIG. 7). Here, though there may be a case where the metal silicide film in the trench is excessively etched to form a concave portion, since there is a margin of the thickness of the polycrystalline silicon film with regard to a trench surface of Si, over-etching up to that amount does not matter.

For example, in the above example, there is a margin for the over-etching of 0.2 $\mu$m which is the thickness of the polycrystalline silicon.

Figure 8:
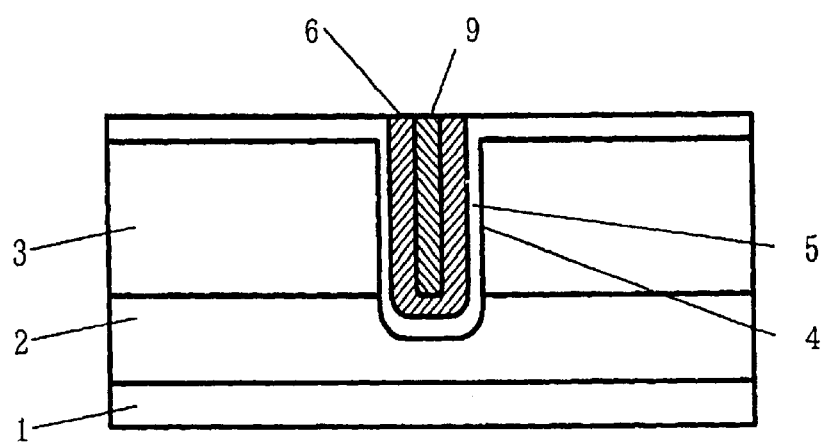
FIG. 8 is a schematic sectional view of a process of the method of manufacturing the vertical MOS transistor according to the present invention.

Then, the polycrystalline silicon exposed by the above etching of the metal silicide film is removed by etching back with gas having high selectivity with regard to the metal silicide film (FIG. 8). This process can be carried out without lowering a throughput of the two kinds of etching by changing the conditions of the etching in the same chamber.

Figure 2:
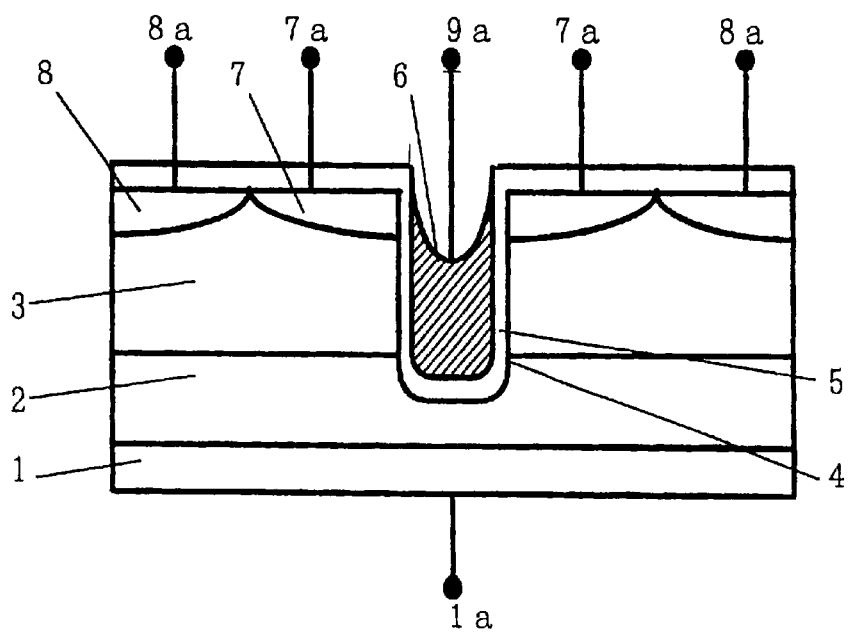
FIG. 2 is a schematic sectional view of a conventional vertical MOS transistor.
Figure 10:
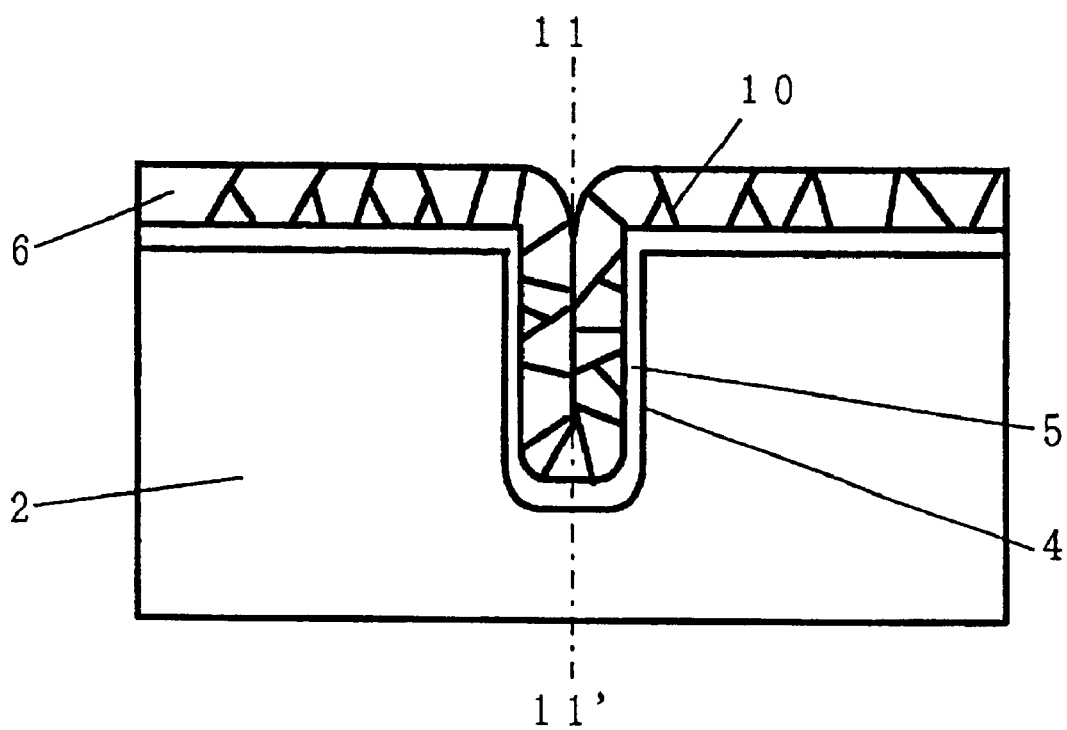
FIG. 10 is a schematic sectional view of the conventional vertical MOS transistor after polycrystalline silicon is deposited.

Here, since a polycrystalline silicon film and a metal silicide film have good adhesion to each other, and strong adhesion can be obtained especially when silicidation annealing is carried out, the interface between them is not etched faster than other regions when the polycrystalline silicon is etched. In other words, there is no place where the etching rate is locally higher as in the conventional case illustrated in FIG. 10. Therefore, a concave portion as illustrated in FIG. 2 is less liable to be generated. Accordingly, problems such as blockage of an operation of the transistor due to excess over-etching of the polycrystalline silicon to remove polycrystalline silicon on a channel, or a crack caused by formation of a void in a later process and insufficient reliability based thereon do not occur.

Figure 9:
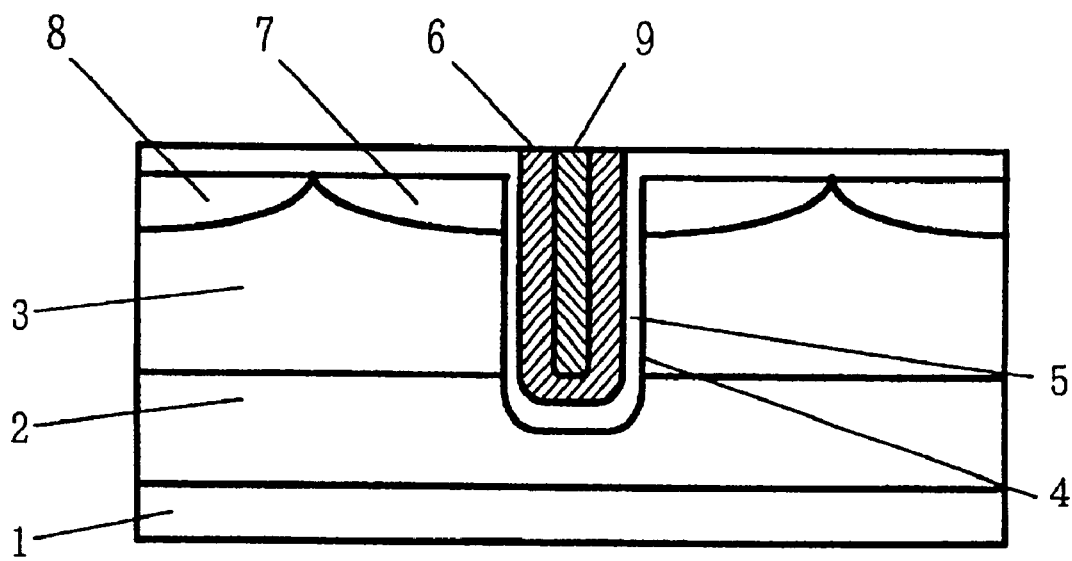
FIG. 9 is a schematic sectional view of a process of the method of manufacturing the vertical MOS transistor according to the present invention.

Next, as in an ordinary manufacturing process of a MOS transistor, As for forming a heavily doped source region is implanted, B or $BF_2$ for forming a heavily doped body contact region is implanted, and they are activated (FIG. 9).

Then, as in an ordinary manufacturing process of a MOS transistor, an intermediate insulating film is formed, contact holes are formed, metal wirings are formed, and a protective film is formed, though not shown in the figures, to form a main portion of the vertical MOS transistor.

The vertical MOS transistor according to the present invention having the above-described manufacturing processes and the above-described structure has the following characteristics.

First, since the gate has a laminated structure of the conventionally used polycrystalline silicon film and the metal suicide film, the gate resistance value can be lowered to 20% or less of that of the conventional art with only the polycrystalline silicon film. Especially, since the metal silicide reaches near the channel at a bottom portion of the trench, the inversion/depletion operation of the channel is fast, and turn-on characteristics and turn-off characteristics are improved. This allows a faster vertical MOS transistor, and operation at the level of MHz can be carried out effectively.

Secondly, since, as described above, the gate has a laminated structure of the polycrystalline silicon film and the metal silicide film, and they are etched under different conditions of the gas, a concave portion or a void is not generated at an upper portion of the gate, and thus, decrease in the yield due to malfunction, insufficient reliability, and the like can be suppressed.

Figure 11:
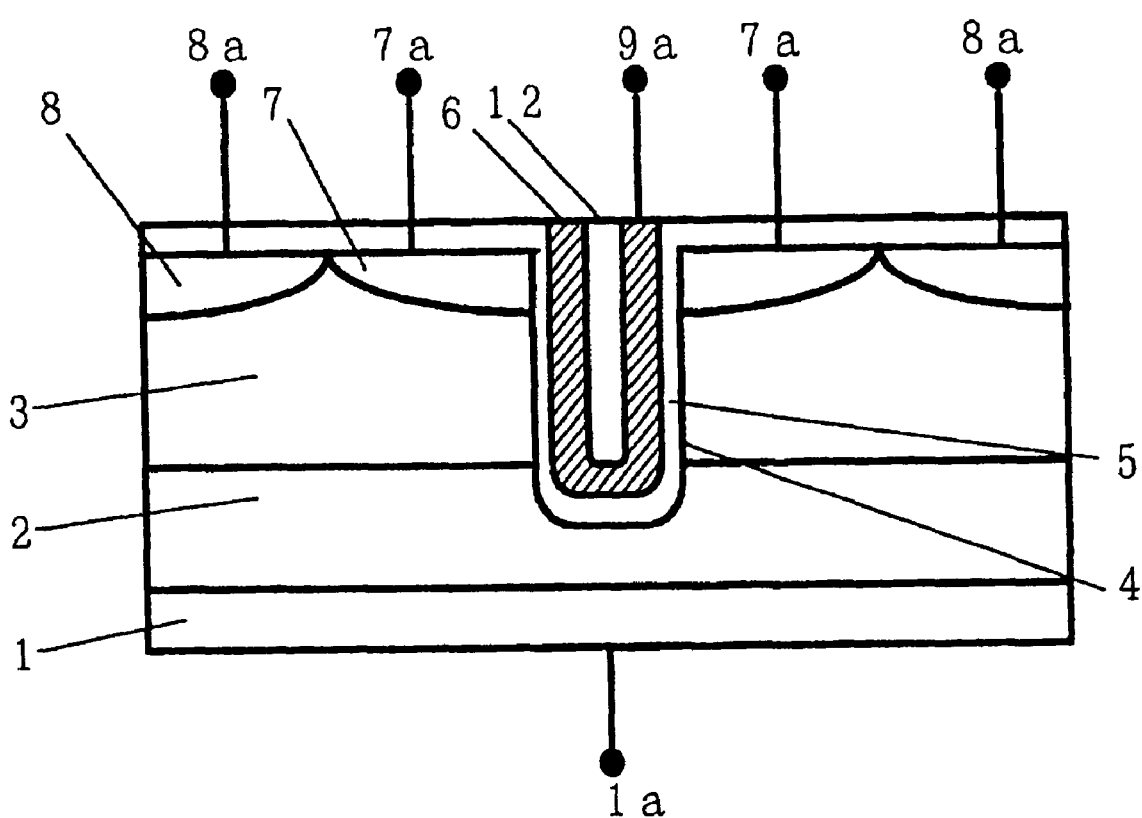
FIG. 11 is a schematic sectional view of a vertical MOS transitor according to another embodiment of the present invention.

Especially, the latter characteristic of the above can be implemented also by a structure illustrated in FIG. 11, where an oxide film 12 is formed instead of the metal silicide 9 formed inside the polycrystalline silicon film in the trench.

The manufacturing processes are schematically described in the following. First, as illustrated in FIGS. 3–5, a body region of a second conductive type is formed on a semiconductor substrate having a heavily doped impurity region of a first conductive type and a lightly doped epitaxial region of the first conductive type. Then, a trench through the body region is formed, edge portions of the trench are rounded, a gate insulating film is formed on an inner wall of the trench, and polycrystalline silicon containing a high concentration of impurity is deposited at a thickness so as not to completely fill the trench.

Then, the oxide film is formed by oxidizing the polycrystalline silicon through thermal oxidation until an inside of the polycrystalline silicon in the trench is filled. The oxide film is etched back so as to leave only the oxide film inside the trench.

After that, as illustrated in FIGS. 8 and 9, the polycrystalline silicon film is etched back under different conditions of the gas from those with regard to the above etching of the oxide film to form a heavily doped source region and a heavily doped body contact region. Then, an intermediate insulating film is formed, contact holes are formed, metal wirings are formed, and a protective film is formed to form a main portion of a vertical MOS transistor.

In this case also, since a gate has a laminated structure of the polycrystalline silicon film and the silicon oxide silicide film, and they are etched under different conditions of the gas, a concave portion or a void is not generated over an upper portion of the gate, and thus, decrease in the yield due to malfunction, insufficient reliability, and the like can be suppressed.

Such a film formed inside the polycrystalline silicon in the trench is not limited to the oxide film described above. By adopting etching conditions such that the etching selectivity rate with regard to the polycrystalline silicon is high, other silicon compounds such as a silicon nitride film may also be applied. Further, as long as strong adhesion to the polycrystalline silicon film can be obtained, a metal film may also be adopted. In this case, the best effect can be obtained with regard to lowering the gate resistance.

According to the present invention, the gate resistance of a vertical MOS transistor can be remarkably lowered to improve the high frequency characteristics. Further, since malfunction and insufficient reliability due to over-etching when a gate is formed can be suppressed, the yield can be improved and the price can be lowered accordingly.

What is claimed is:

1. A vertical MOS transistor comprising:

a semiconductor substrate having a first conductivity type;

an epitaxial growth layer having the first conductivity type formed on the semiconductor substrate;

a body region having a second conductivity type formed on the epitaxial growth layer;

a trench having a sidewall extending through the body region of the second conductivity type and having a bottom surface disposed inside of the epitaxial growth layer of the first conductivity type;

a gate insulating film formed of a first gate material and extending along an upper surface of the body region of the second conductivity type and the sidewall and the bottom surface of the trench and having a U-shaped form so as to define a U-shaped void within the trench;

a polycrystalline silicon gate partially filling the internal void of the gate insulating film;

a second gate material comprised of one of a silicon oxide film and a silicon nitride film filling a remaining portion of the internal void not filled by the polycrystalline silicon gate so as to be in contact with the polycrystalline silicon gate and having a sidewall and a bottom surface that are surrounded by the gate insulating film and the polycrystalline silicon gate;

a source region of the first conductivity type formed in the upper surface of the body region of the second conductivity type and around the trench so as to be in contact with the gate insulating film;

a gate electrode connected to the polycrystalline silicon gate and the second gate material;

a source electrode connected to the source region; and a drain electrode connected to the semiconductor substrate.

2. A vertical MOS transistor according to claim 1; wherein the first gate material comprises silicon oxide.

3. A vertical MOS transistor according to claim 1; wherein the trench is formed in a U shape.

* * * * *